(12) United States Patent
Zheng

(10) Patent No.: US 10,884,293 B2
(45) Date of Patent: Jan. 5, 2021

(54) METHOD OF COATING AN ALIGNMENT FILM AND DEVICE THEREOF

(71) Applicant: Wuhan China Star Optoelectronics Technology Co., Ltd., Hubei (CN)

(72) Inventor: Junfeng Zheng, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 567 days.

(21) Appl. No.: 15/748,493

(22) PCT Filed: Jan. 4, 2018

(86) PCT No.: PCT/CN2018/071264
§ 371 (c)(1),
(2) Date: Jan. 29, 2018

(87) PCT Pub. No.: WO2019/119537
PCT Pub. Date: Jun. 27, 2019

(65) Prior Publication Data
US 2020/0124893 A1    Apr. 23, 2020

(30) Foreign Application Priority Data
Dec. 19, 2017 (CN) .......................... 2017 1 1378183

(51) Int. Cl.
*G02F 1/1337* (2006.01)
*H01L 27/12* (2006.01)

(52) U.S. Cl.
CPC ...... *G02F 1/13378* (2013.01); *H01L 27/1292* (2013.01); *B32B 2457/20* (2013.01)

(58) Field of Classification Search
CPC ............... G02F 1/13378; G02F 1/1339; H01L 27/1292; B32B 2457/20; B32B 38/1841; Y10T 156/10; B41M 3/003
See application file for complete search history.

(56) References Cited

U.S. PATENT DOCUMENTS 7,459,322 B2 * 12/2008 Ito ....................... H01L 27/3246
438/29
9,174,425 B2 * 11/2015 Van Den Brand ...... H01L 51/56
(Continued)

FOREIGN PATENT DOCUMENTS

| CN | 202837753 U | | 3/2013 |
| CN | 103481650 | * | 1/2016 |
| FR | 2845299 A1 | | 4/2004 |

OTHER PUBLICATIONS

CN202837753U , machine translation, 2013 (Year: 2013).*
FR2845299, machine translation,Sep. 2004 (Year: 2004).*
CN103481650 (B) , 2016, machine translation (Year: 2016).*

*Primary Examiner* — Tracie Y Green
(74) *Attorney, Agent, or Firm* — Hemisphere Law, PLLC; Zhigang Ma

(57) ABSTRACT

A display and a method of coating an alignment film are provided. The method of coating an alignment film includes step S10, providing substrate to-be-coating with the alignment film, positioned the substrate to-be-coating with the alignment film on optical bench; step S11, pressing against to the substrate by a print wheel has alignment film printing template, and rolling by predetermined coating direction, uniform coating alignment liquid on to-be-coating region of the substrate; wherein, the substrate rolling with the optical bench and forms changing angle with horizontal surface during the coating process; and step S12, controlling the optical bench for driving the substrate to vibrate after coating the to-be-coating region. In this invention provides (Continued)

a method could suit to difference mobility alignment film, it could greatly enhances uniformity of the alignment film such decrease opportunity to Mura happened by worse quality of printing the alignment film.

15 Claims, 4 Drawing Sheets

(56) References Cited

U.S. PATENT DOCUMENTS

| | | | |
|---|---|---|---|
| 9,223,176 B2 * | 12/2015 | Zhu | G02F 1/13 |
| 2006/0146425 A1 * | 7/2006 | Zimmermann | G02B 6/4228 |
| | | | 359/819 |
| 2013/0022738 A1 * | 1/2013 | Deng | G02F 1/1341 |
| | | | 427/162 |

* cited by examiner

METHOD OF COATING AN ALIGNMENT FILM AND DEVICE THEREOF

RELATED APPLICATIONS

The present application is a National Phase of International Application Number PCT/CN2018/071264, filed Jan. 4, 2018, and claims the priority of China Application No. 201711378183.0, filed Dec. 19, 2017.

FIELD OF THE DISCLOSURE

The disclosure relates to a display technical field, and more particularly to a method of coating an alignment film and device thereof.

BACKGROUND

Currently, Liquid Crystal Display (LCD) is widely used to many electrode products as a display element of the electric device. It is needs to coat and form an alignment layer on the array substrate or a color filter substrate while cell process of the LCD.

In the existing technology, the key printing way of the alignment film of the LCD is printing alignment liquid (such as PI liquid) to form the alignment film by tradition printer. Therefore, it will have some defects. Firstly, the alignment liquid has highly mobility so that it easily causes Mura phenomenon around the liquid crystal panel, especially generated alignment liquid accumulation on short side of the liquid crystal after printing. In addition, if the uniformity of the alignment film could not achieve to requirement, it will caused the alignment liquid not-stick or miss printing. Even thought it could buffer by increases ink-containing of the alignment film, but if increases ink-containing of the alignment film is easy to decrease mobility. Therefore, solve problem of how to decrease Mura phenomenon and increase product yield in the present alignment film forming technology is the most important issue.

SUMMARY

A technical problem to be solved by the disclosure is to provide a method of coating an alignment film and a device of coating an alignment film. There is suit to difference mobility alignment film, and could greatly enhance uniformity of the alignment film such that decrease Mura by worse printing of the alignment film.

An objective of the disclosure is achieved by following embodiments. In particular, A method of coating an alignment film, comprising step S10, providing a substrate to-be-coating with the alignment film, positioned the substrate to-be-coating with the alignment film on an optical bench;

step S11, pressing against to the substrate by a print wheel has an alignment film printing template, and rolling by a predetermined coating direction, uniform coating an alignment liquid on a to-be-coating region of the substrate; wherein, the substrate rolling with the optical bench and forms a changing angle with a horizontal surface during the coating process; and step S12, controlling the optical bench for driving the substrate to vibrate after coating the to-be-coating region.

In an embodiment, the method further comprising:
dropping the alignment liquid on an arranging film wheel by nozzle;

uniform transferring the alignment liquid on the arranging film wheel to the alignment film printing template of the print wheel, and scraped smooth by scraper.

In an embodiment, the predetermined coating direction of the step S11 is the length direction of each liquid crystal panels of the substrate, the coating process is form a first side of the substrate to a second side of the substrate.

In an embodiment, while the print wheel is located on the first side of the substrate, a first angle is formed between the substrate and the horizontal surface; while the print wheel is located on the second side of the substrate, a second angle is formed between the substrate and the horizontal surface; during rotation of the print wheel, the angle between the substrate and the horizontal surface is transits from the first angle to the second angle; wherein the first angle is between −5~0 degree, the second angle is between 0~5 degree.

In an embodiment, in the step S12 further comprising:
controlling the optical bench and driving the substrate to vibrate back and forth along the coating direction of the print wheel;

wherein oscillation range of the optical bench is 1~5 mm, vibration frequency is 3~5 per second, duration time is 3~5 second.

According to another aspect of the disclosure, the disclosure further provides a method of coating an alignment film, comprising step S10, providing a substrate to-be-coating with the alignment film, positioned the substrate to-be-coating with the alignment film on an optical bench;

step S11, pressing against to the substrate by a print wheel has an alignment film printing template, and rolling by a predetermined coating direction, uniform coating an alignment liquid on a to-be-coating region of the substrate; wherein, the substrate rolling with the optical bench and forms a changing angle with a horizontal surface during the coating process;

step S12, controlling the optical bench and driving the substrate to vibrate back and forth along the coating direction of the print wheel after coating the to-be-coating region.

In an embodiment, the method further comprising:
dropping the alignment liquid on an arranging film wheel by nozzle;

uniform transferring the alignment liquid on the arranging film wheel to the alignment film printing template of the print wheel, and scraped smooth by scraper.

In an embodiment, the predetermined coating direction of the step S11 is the length direction of each liquid crystal panels of the substrate, the coating process is form a first side of the substrate to a second side of the substrate.

In an embodiment, while the print wheel is located on the first side of the substrate, a first angle is formed between the substrate and the horizontal surface; while the print wheel is located on the second side of the substrate, a second angle is formed between the substrate and the horizontal surface; during rotation of the print wheel, the angle between the substrate and the horizontal surface is transits from the first angle to the second angle; wherein the first angle is between −5~0 degree, the second angle is between 0~5 degree.

In an embodiment, oscillation range of the optical bench is 1~5 mm, vibration frequency is 3~5 per second, duration time is 3~5 second.

According to further another aspect of the disclosure, the disclosure further provides a device of coating an alignment film, comprising:

an optical bench for positioned a substrate to-be-coating with the alignment film, the optical bench could up-down rotate around middle part of a main body of the optical bench by a certain angle;

an arranging film wheel receiving an alignment liquid;

a print wheel mounted an alignment film printing template mating with the arranging film wheel for receiving the alignment liquid from the arranging film wheel, and coating the alignment liquid on a to-be-coating region of the substrate along the coating direction;

a vibration controlling device for controlling vibration of the optical bench after finish coating the to-be-coating region;

wherein, the print wheel continued presses against the substrate to-be-coating with the alignment film and rotates in the coating direction, forming a changing angled between the optical bench and a horizontal surface.

In an embodiment, the device further comprising:

a nozzle dropping the alignment liquid on the arranging film wheel; and a scraper for scrapping smooth the alignment liquid after transferred the alignment liquid from the arranging film wheel to the alignment film printing template of the print wheel In an embodiment, the predetermined coating direction is the length direction of each liquid crystal panels of the substrate, the coating process is form a first side of the substrate to a second side of the substrate, rotating axis of the optical bench is position in the middle position.

In an embodiment, while the print wheel is located on the first side of the optical bench, a first angle is formed between the optical bench and the horizontal surface; while the print wheel is located on the second side of the optical bench, a second angle is formed between the optical bench and the horizontal surface; during rotation of the print wheel, the angle between the optical bench and the horizontal surface is transits from the first angle to the second angle; wherein the first angle is between −5~0 degree, the second angle is between 0~5 degree.

In an embodiment, the vibration controlling device controlling the optical bench to vibrate back and forth along the coating direction of the print wheel, oscillation range is 1~5 mm, vibration frequency is 3~5 per second, duration time is 3~5 second.

In the embodiments of this disclosure has beneficial to the following described.

Firstly, in these embodiments, coating the to-be-coating region of the substrate from the long side direction of the liquid crystal panel could greatly decreases the alignment liquid accumulation phenomenon on the terminal side of the short side of the liquid crystal panel and the opposite side of the terminal. Therefore, it could improve uniformity of alignment film of short side terminal of the liquid crystal panel.

In addition, in this embodiment, there has a certain angle between the optical bench and horizontal surface. The angle could be adjusted by press force of the print wheel. It could suit to coat by different alignment liquid, and it also could control the printing accuracy range and diffusion for the alignment liquid which containing high ink and lower mobility.

Furthermore, in these embodiments of the disclosure. After printing the alignment film, control the optical bench vibrates back and forth along the long direction of the liquid crystal panel which could greatly improve uniformity of the alignment film. It improves the irregular printing situation of the alignment film of the edge of the liquid crystal panel such that reduce missing printing the alignment film and the non-sticking of the alignment film, and decrease the Mura phenomenon caused by the printing quality of the alignment film.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
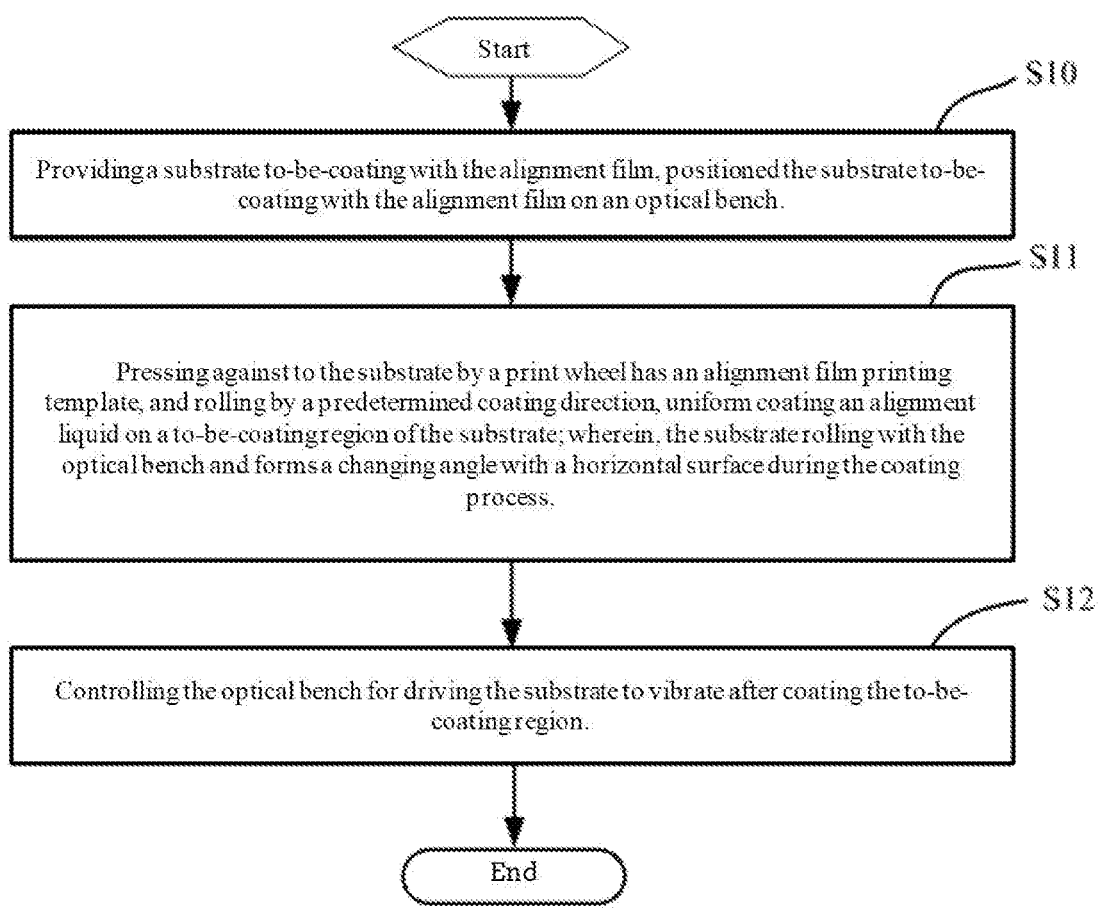
FIG. 1 is a main flow chart diagram of a method of coating an alignment film according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

Here, it needs to be further explained that in order to avoid causing the present disclosure to be vague due to unnecessary details, the structures and/or processes closely related to the solution of the present disclosure are only illustrated in the drawings, while other details which are of less concern about the present disclosure are omitted.

Please refer to FIG. 1. FIG. 1 is a main flow chart diagram of a method of coating an alignment film according to an embodiment of the disclosure. In the following, method with the disclosure will be described with reference to FIG. 2 through FIG. 4. The method of coating an alignment film comprises as following steps.

Step S10, providing a substrate 2 to-be-coating with the alignment film, and positioned the substrate to-be-coating with the alignment film on an optical bench 1, the optical bench 1 could up-down rotate around middle part of a main body of the optical bench by a certain angle. Specifically, the substrate 2 is positioned on the optical bench 1 by mechanical arm.

Step S11, providing a print wheel 11(P wheel) and an arranging film wheel 12 (A wheel). An alignment film printing template 15 (APR template) is mounted on the print wheel 11. The print wheel 11 is mating with the arranging film wheel 12, and receiving the alignment liquid form the arranging film wheel 12, and coating the alignment liquid on the to-be-coating region of the substrate 2 along the coating direction. The print wheel 11 continues pressing against the to-be-coating region of the substrate 2 and rolling by a predetermined coating direction, and uniform coating an alignment liquid on the to-be-coating region of the substrate 2 during the coating process. In this process, the substrate 2 rolling with the optical bench 10 and forms a changing angle with a horizontal surface during the coating process.

Step S12, controlling the optical bench 10 for driving the substrate 2 to vibrate after coating the to-be-coating region. Specifically, in an example, after the print wheel 11 leaving the substrate 2, it could control the optical bench 10 vibrates back and forth along the coating direction of the print wheel 11. The oscillation range of the optical bench is 1~5 mm, vibration frequency is 3~5 per second, duration time is 3~5 second.

Wherein, it is noted that in the step S11 further comprising following steps.

Dropping the alignment liquid on an arranging film wheel 12 by a nozzle 13.

Uniform transferring the alignment liquid on the arranging film wheel 12 to the alignment film printing template 15 of the print wheel 11, and scraped smooth by scraper 14.

In an embodiment, the predetermined coating direction of the step S11 is the length direction of each liquid crystal panels 20 of the substrate 2, the coating process is form a first side (such as right side) of the substrate 2 to a second side (such as left side) of the substrate.

It is noted that, in an embodiment, the substrate 2 could up-down rotate around middle part of a main body of rotating axis 100 by a certain angle. Please refer to FIG. 2, while the print wheel 11 is located on the first side of the optical bench 10, the substrate 2 and the optical bench 10 receiving downwardly press against force, and forming a first angle a with the horizontal surface. It is noted that, in this embodiment, the substrate 2 and bottom surface of the optical bench 10 are substantially parallel to each other in this embodiment, so that only illustrates the angle a between the optical bench 10 and the horizontal surface. Please refer to FIG. 3, while the print wheel 11 is located on the second side of the optical bench 10, the substrate 2 and the optical bench 10 receiving downwardly press against force, and forming a second angle b with the horizontal surface. During rotation and coating process of the print wheel 11, the angle between the substrate 2 and the horizontal surface of the optical bench 10 is transits from the first angle a to the second angle b. In an embodiment, the first angle a is between −5~0 degree, the second angle b is between 0~5 degree.

Correspondingly, a device of coating an alignment film is provided by this disclosure. Please refer to FIG. 2 to FIG. 4. In this embodiment, the device of coating an alignment film comprises.

An optical bench 10 for positioned a substrate 2 to-be-coating with the alignment film, the optical bench 10 could up-down rotate around middle part of a main body of the optical bench 10 by a certain angle. In an embodiment, the rotating axis 100 of the optical bench 10 is positioned in the middle position.

An arranging film wheel 12 receiving an alignment liquid.

A print wheel 11 is mounted an alignment film printing template 15 which mating with the arranging film wheel 12 for receiving the alignment liquid from the arranging film wheel 12, and coating the alignment liquid on a to-be-coating region of the substrate 2 along the coating direction.

A vibration controlling device 101 for controlling vibration of the optical bench 10 after finished coating the to-be-coating region. Specifically, in an embodiment, the vibration controlling device 101 includes a mechanical device has vibration motor. The vibration controlling device 101 could control the optical bench 10 vibrates back and forth along the coating direction, and the oscillation range is 1~5 mm, vibration frequency is 3~5 per second, duration time is 3~5 second.

A nozzle 13 dropping the alignment liquid on the arranging film wheel 12.

A scraper 14 for scrapping smooth the alignment liquid after transferred the alignment liquid from the arranging film wheel 12 to the alignment film printing template 15 of the print wheel 11.

Figure 2:
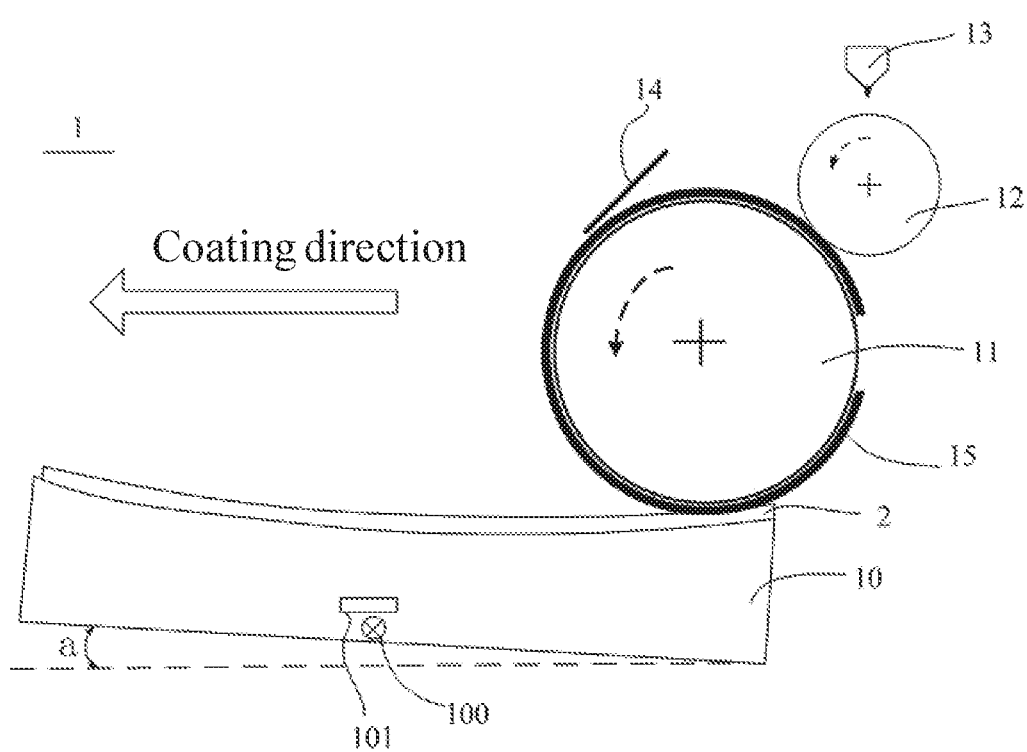
FIG. 2 is a partially structural schematic view of a device of coating an alignment film in first state according to an embodiment of the disclosure.
Figure 3:
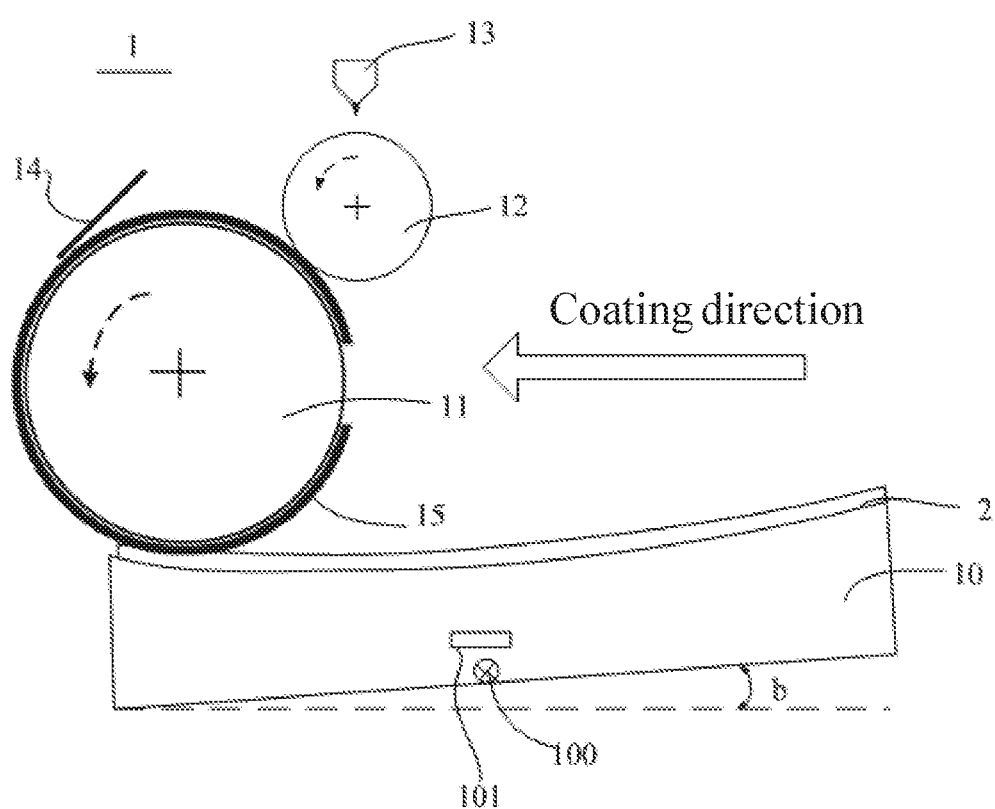
FIG. 3 is a partially structural schematic view of a device of coating an alignment film in second state according to an embodiment of the disclosure.

It is noted that, FIG. 2 and FIG. 3 only illustrate the main portion of the device of coating the alignment film which related to this disclosure. The other structures of the device could be obtained by the person in the skill, such as, the rack, the structure of driving rack, arranging film wheel and the connecting relation between the print wheel and the rack, device of storage alignment liquid, pump of driving the alignment liquid to the nozzle and other structures.

Wherein, the print wheel 11 continuously provides a certain press force to against the substrate 2 to-be-coating with the alignment film and rolling by the coating direction, such that forming the changing angle between the optical bench 10 and the substrate 2 and the horizontal surface. The predetermined coating direction is the length direction of each liquid crystal panels 20 of the substrate 2, the coating process is form the first side (such as right side) of the optical bench 10 to the second side (such as left side) of the optical bench 10.

It is noted that, in an embodiment, the optical bench 10 could up-down rotate around middle part of a main body of rotating axis 100 by a certain angle. Please refer to FIG. 2, while the print wheel 11 is located on the first side of the optical bench 10, the optical bench 10 receiving downwardly press against force, and forming a first angle a with the horizontal surface. Please refer to FIG. 3, while the print wheel 11 is located on the second side of the optical bench 10, the optical bench 10 receiving downwardly press against force, and forming a second angle b with the horizontal surface. During rotation and coating process of the print wheel 11, the angle between the optical bench 10 and the horizontal surface is transits from the first angle a to the second angle b. In an embodiment, the first angle a is between −5~0 degree, the second angle b is between 0~5 degree.

Figure 4:
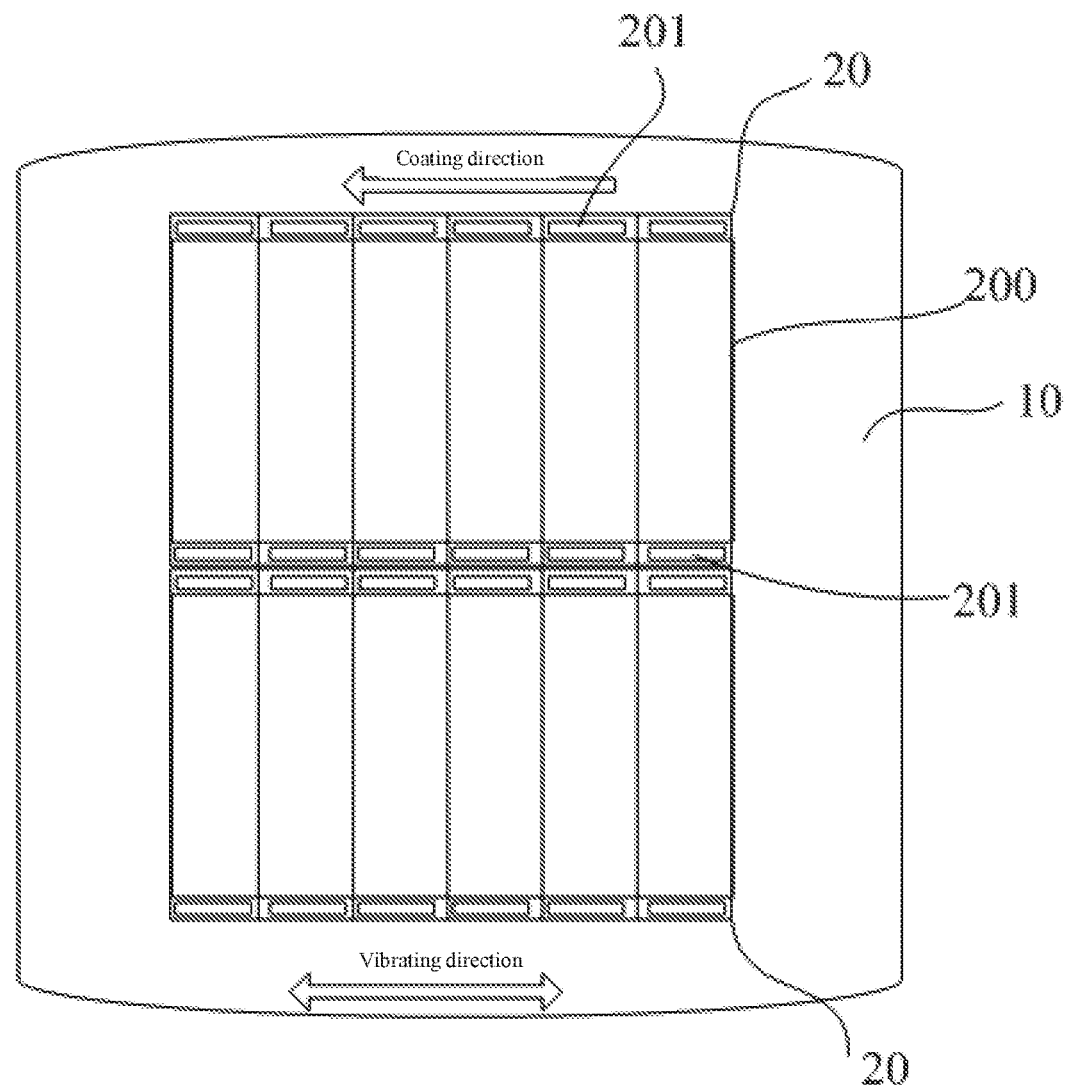
FIG. 4 is a top schematic view of a device of coating an alignment film on the optical bench after coating according to an embodiment of the disclosure.

Please refer to FIG. 4, FIG. 4 is a top schematic view of a device of coating an alignment film on the optical bench after coating according to an embodiment of the disclosure. Here, the substrate 2 includes two liquid crystal panels 20, there have to-be-coating regions 200 on each of the liquid crystal panels 20, the alignment film printing template 15 is contacting with the to-be-coating region 200 and coating to form an alignment film, outside of the to-be-coating regions 200 is terminal side 201. The coating direction is length direction of the liquid crystal panel 20. It is noted that, while coating along the length direction of the liquid crystal panel 20, and vibrating along the length direction of the optical bench 10, it could reduce effect of refluxing to aggregation the alignment liquid for terminal side 201, and decrease Mura phenomenon on short side, and enhance uniform of coating the alignment film.

In the embodiments of this disclosure has beneficial to the following described.

Firstly, in these embodiments, coating the to-be-coating region of the substrate from the long side direction of the liquid crystal panel could greatly decreases the alignment liquid accumulation phenomenon on the terminal side of the short side of the liquid crystal panel and the opposite side of the terminal. Therefore, it could improve uniformity of alignment film of short side terminal of the liquid crystal panel.

In addition, in this embodiment, there has a certain angle between the optical bench and horizontal surface. The angle could be adjusted by press force of the print wheel. It could suit to coat by different alignment liquid, and it also could control the printing accuracy range and diffusion for the alignment liquid which containing high ink and lower mobility.

Furthermore, in these embodiments of the disclosure. After printing the alignment film, control the optical bench vibrates back and forth along the long direction of the liquid crystal panel which could greatly improve uniformity of the alignment film. It improves the irregular printing situation of the alignment film of the edge of the liquid crystal panel such that reduce missing printing the alignment film and the non-sticking of the alignment film, and decrease the Mura phenomenon caused by the printing quality of the alignment film.

It should be explained that the relationship terms, such as first and second, etc., in the present specification are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors existing in the process, method, object or device which includes the factors.

Obviously, the protection scope of the present invention is not limited to the above detailed descriptions, and those skilled in the art may make various changes and modifications to the invention without departing from the scope and spirit of the invention. As such, if these changes and modifications of the present invention belong to the scope of the claims of the present invention and equivalent technologies thereof, the present invention also intends to include these changes and modifications here.

What is claimed is:

1. A method of coating an alignment film, comprising
step S10, providing a substrate to-be-coating with the alignment film, and positioning the substrate to-be-coating with the alignment film on an optical bench, wherein the optical bench is capable of up-down rotating with a certain angle around a rotating axis located at a middle part of a main body of the optical bench;
step S11, using a print wheel mounted with an alignment film printing template and mating with an arranging film wheel, to press against the substrate, receive an alignment liquid from the arranging film wheel and coat the alignment liquid on a to-be-coating region of the substrate along a predetermined coating direction; wherein, the print wheel rolls along the predetermined coating direction, the substrate rotates together with the optical bench around the rotating axis and a changing angle of the optical bench with respect to a horizontal surface is formed during a process of coating the alignment liquid on the to-be-coating region of the substrate along the predetermined coating direction; and step S12, controlling the optical bench for driving the substrate to vibrate after coating the alignment liquid on the to-be-coating region and the print wheel leaving the substrate.

2. The method of coating an alignment film according to claim 1, further comprising
dropping the alignment liquid on the arranging film wheel by a nozzle;
uniform transferring the alignment liquid on the arranging film wheel to the alignment film printing template of the print wheel, and scraped smooth by a scraper.

3. The method of coating an alignment film according to claim 2, wherein the predetermined coating direction of the step S11 is a length direction of each of liquid crystal panels of the substrate, the process of coating is from a first side of the substrate to a second side of the substrate.

4. The method of coating an alignment film according to claim 3, wherein a first angle is formed between the substrate and the horizontal surface when the print wheel is located on the first side of the substrate; a second angle is formed between the substrate and the horizontal surface when the print wheel is located on the second side of the substrate; during the rolling of the print wheel, the angle between the substrate and the horizontal surface transits from the first angle to the second angle; wherein the first angle is between −5~0 degree, and the second angle is between 0~5 degree.

5. The method of coating an alignment film according to claim 4, wherein in the step S12 further comprising
controlling the optical bench and driving the substrate to vibrate back and forth along the coating direction of the print wheel;
wherein oscillation range of the optical bench is 1~5 mm, vibration frequency is 3~5 per second, duration time is 3~5 second.

6. A method of coating an alignment film, comprising
step S10, providing a substrate to-be-coating with the alignment film, and positioning the substrate to-be-coating with the alignment film on an optical bench, wherein the optical bench is configured for up-down rotating with a certain angle around a rotating axis located at a middle part of a main body of the optical bench;
step S11, using a print wheel mounted with an alignment film printing template and mating with an arranging film wheel, to press against the substrate, receive an alignment liquid from the arranging film wheel and coat the alignment liquid on a to-be-coating region of the substrate along a predetermined coating direction; wherein, the print wheel rolls along the predetermined coating direction, the substrate rotates together with the optical bench around the rotating axis and a changing angle between the optical bench and a horizontal surface is formed during a process of coating the alignment liquid on the to-be-coating region of the substrate along the predetermined coating direction;
step S12, controlling the optical bench and driving the substrate to vibrate back and forth along the predetermined coating direction of the print wheel after coating the alignment liquid on the to-be-coating region and the print wheel leaving the substrate.

7. The method of coating an alignment film according to claim 6, further comprising dropping the alignment liquid on the arranging film wheel by a nozzle;
uniform transferring the alignment liquid on the arranging film wheel to the alignment film printing template of the print wheel, and scraped smooth by a scraper.

8. The method of coating an alignment film according to claim 6, wherein the predetermined coating direction of the step S11 is a length direction of each of liquid crystal panels of the substrate, the process of coating is from a first side of the substrate to a second side of the substrate.

9. The method of coating an alignment film according to claim 6, wherein a first angle is formed between the substrate and the horizontal surface when the print wheel is located on a first side of the substrate; a second angle is formed between the substrate and the horizontal surface when the print wheel is located on a second side of the substrate; during the rolling of the print wheel, the angle between the substrate and the horizontal surface transits from the first angle to the second angle; wherein the first angle is between −5~0 degree, the second angle is between 0~5 degree.

10. The method of coating an alignment film according to claim 6, wherein oscillation range of the optical bench is 1~5 mm, vibration frequency is 3~5 per second, duration time is 3~5 second.

11. . A device of coating an alignment film, comprising
an optical bench for being positioned a substrate to-be-coating with the alignment film, wherein the optical bench is configured for up-down rotating with a certain angle around a rotating axis located at a middle part of a main body of the optical;
an arranging film wheel for receiving an alignment liquid;
a print wheel mounted an alignment film printing template mating with the arranging film wheel for receiving an alignment liquid from the arranging film wheel, and coating the alignment liquid on a to-be-coating region of the substrate along a coating direction;
a vibration controlling device for controlling vibration of the optical bench after coating the alignment liquid on the to-be-coating region and the print wheel leaving the substrate;
wherein, the print wheel is configured for continually pressing against the substrate to-be-coating with the alignment film and rolling in the coating direction during coating the alignment liquid on the to-be-coating region, thereby forming a changing angle between the optical bench and a horizontal surface.

12. The device of coating an alignment film according to claim 11, further comprising
a nozzle dropping the alignment liquid on the arranging film wheel; and
a scraper for scrapping smooth the alignment liquid transferred from the arranging film wheel to the alignment film printing template of the print wheel.

13. The device of coating an alignment film according to claim 11, wherein the coating direction is a length direction of each of liquid crystal panels of the substrate, the coating process is from a first side of the substrate to a second side of the substrate.

14. The device of coating an alignment film according to claim 13, wherein a first angle is formed between the optical bench and the horizontal surface when the print wheel is located on the first side of the optical bench; a second angle is formed between the optical bench and the horizontal surface when the print wheel is located on the second side of the optical bench; during the rolling of the print wheel, the angle between the optical bench and the horizontal surface transits from the first angle to the second angle; wherein the first angle is between −5~0 degree, the second angle is between 0–5 degree.

15. The device of coating an alignment film according to claim 14, wherein the vibration controlling device controlling the optical bench to vibrate back and forth along the coating direction of the print wheel, oscillation range is 1~5 mm, vibration frequency is 3~5 per second, duration time is 3~5 second.

* * * * *